US005442225A

United States Patent [19]

Rostoker et al.

[11] Patent Number: 5,442,225

[45] Date of Patent: Aug. 15, 1995

[54] INTEGRATED CIRCUIT HAVING INTERCONNECTS WITH RINGING SUPPRESSING ELEMENTS

[75] Inventors: Michael D. Rostoker, San Jose; Nicholas F. Pasch, Pacifica, both of Calif.

[73] Assignee: LSI Logic Corporation, Milpitas, Calif.

[21] Appl. No.: 106,175

[22] Filed: Aug. 13, 1993

[51] Int. Cl.[6] .................... H01L 27/02

[52] U.S. Cl. .................... 257/538; 257/758; 257/760; 257/638

[58] Field of Search .................... 257/760, 758, 359, 904, 257/903, 380, 536, 538, 364, 581, 638

[56] References Cited

U.S. PATENT DOCUMENTS

| | | | |
|---|---|---|---|
| 3,838,442 | 9/1974 | Humphreys | 257/760 |
| 4,016,483 | 4/1977 | Rudin | 257/536 |
| 4,458,295 | 7/1984 | Durschlag et al. | 257/537 |
| 4,475,964 | 10/1984 | Ariizumi et al. | 257/538 |
| 4,484,388 | 11/1984 | Iwasaki | 257/370 |
| 4,551,747 | 11/1985 | Gilbert et al. . | |
| 4,609,903 | 9/1986 | Toyokura et al. | 338/22 SD |
| 4,754,371 | 6/1988 | Nitta et al. . | |
| 4,791,473 | 12/1988 | Phy . | |
| 4,805,147 | 2/1989 | Yamanaka et al. | 257/904 |
| 4,814,849 | 3/1989 | Schrenk . | |
| 4,866,507 | 9/1989 | Jacobs et al. . | |
| 4,899,439 | 2/1990 | Potter et al. | 29/846 |
| 4,907,062 | 3/1990 | Fukushima . | |
| 4,972,253 | 11/1990 | Palino et al. . | |
| 5,089,881 | 2/1992 | Panicker . | |
| 5,107,322 | 4/1992 | Kimura | 257/904 |
| 5,114,873 | 5/1992 | Kim et al. | 437/52 |
| 5,132,771 | 7/1992 | Yamanaka et al. | 257/903 |
| 5,136,358 | 8/1992 | Sakai et al. . | |
| 5,200,696 | 4/1993 | Menis et al. | 324/158 R |
| 5,200,808 | 4/1993 | Koyama et al. | 257/760 |
| 5,210,682 | 5/1993 | Takashima | 257/734 |
| 5,260,594 | 11/1993 | Shimizu | 257/368 |
| 5,309,015 | 5/1994 | Kuwata et al. | 257/758 |
| 5,331,204 | 7/1994 | Kuroda et al. | 257/758 |

FOREIGN PATENT DOCUMENTS 56-132815 10/1981 Japan .

OTHER PUBLICATIONS

Hayt, Jr., *Engineering Electromagnetics*, 1989, McGraw-Hill, pp. 382–386.

*Primary Examiner*—Jerome Jackson
*Assistant Examiner*—Courtney A. Bowers
*Attorney, Agent, or Firm*—Poms, Smith, Lande & Rose

[57] ABSTRACT

Apparatus for improving ON/OFF switching in high speed digital circuitry is disclosed. The present invention includes apparatus for altering the impedance or capacitive loading of the interconnect. Some embodiments reduce back reflections by raising the impedance of the interconnect to be closer to that of the contact, or raising the capacitive loading, and others improve the culprit-victim problem by filtering out the highest frequency components of the pulse on the culprit interconnect. For the back reflection problem, the apparatus for altering can be formed of elements for altering the capacitance or, alternatively the resistance, of the interconnect. For the culprit-victim problem, the apparatus for altering includes elements which alter the effective capacitance or resistance of the culprit interconnect.

6 Claims, 5 Drawing Sheets

810 814 812 Driver $R_{50}$ $R_{40}$ $R_{30}$ $R_{20}$ $R_{10}$ $R_1$ $R_2$ $R_3$ $R_4$ $R_5$ 334 336 338

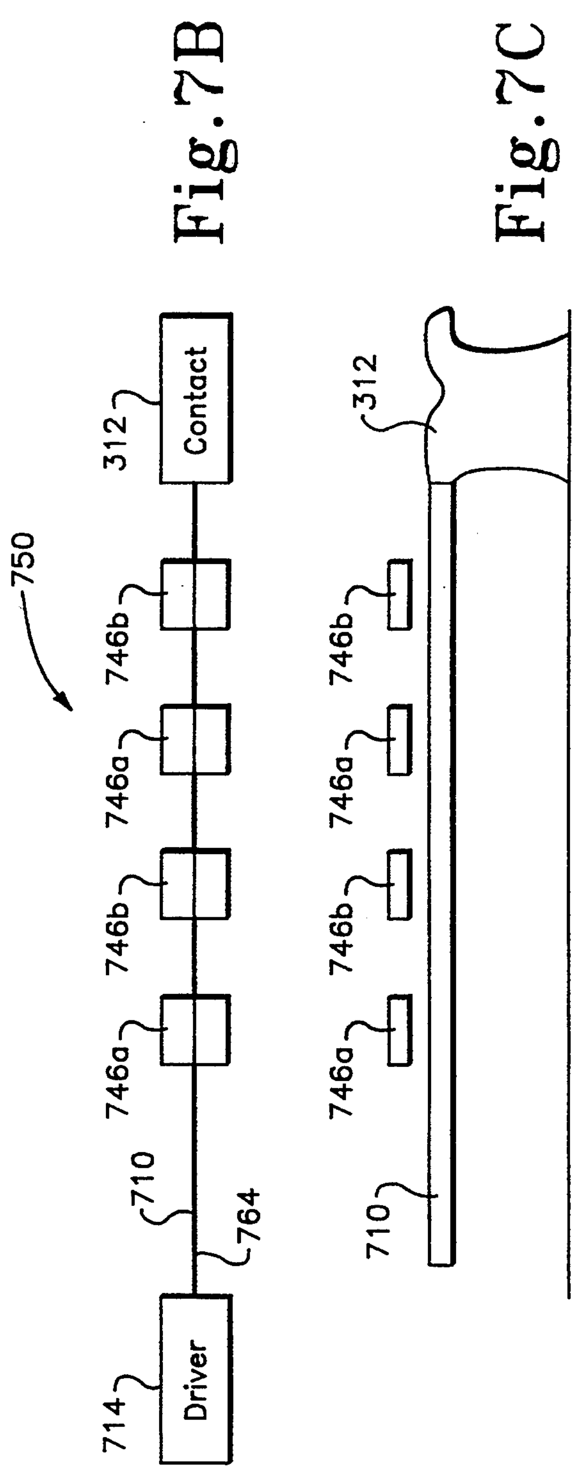
Fig.7B
Fig.7C
750
714
Driver
710
764
746a
746b
746a
746b
312
Contact
746a
746b
746a
746b
312
710
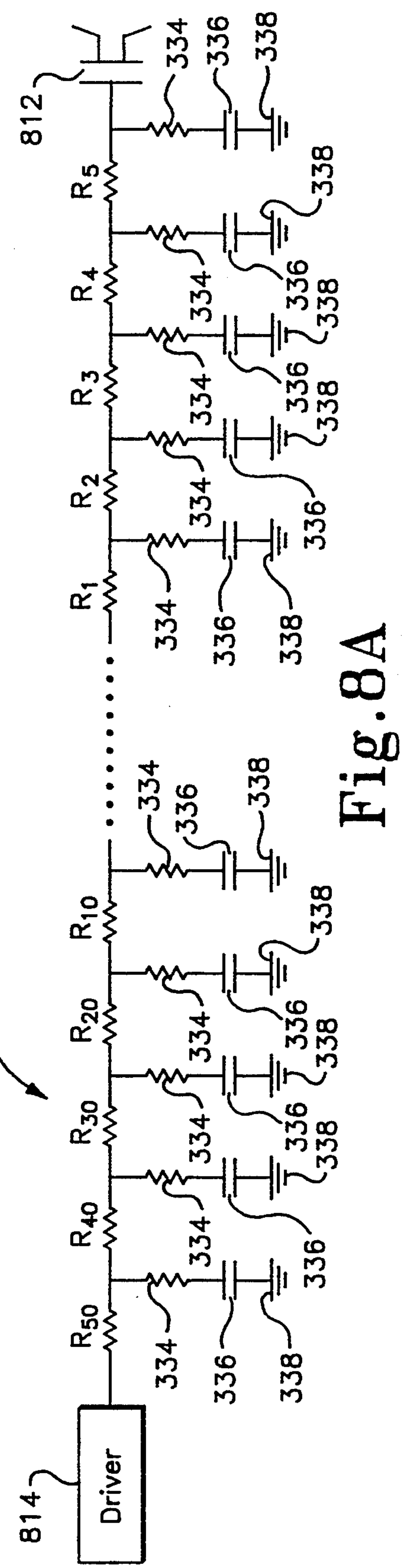
Fig.8A
810
814
Driver
812
R50
R40
R30
R20
R10
R1
R2
R3
R4
R5
334
336
338

INTEGRATED CIRCUIT HAVING INTERCONNECTS WITH RINGING SUPPRESSING ELEMENTS

FIELD OF THE INVENTION

The present invention relates to high speed integrated digital circuits generally and to methods for improving ON/OFF switching of signals in such circuits in particular.

BACKGROUND OF THE INVENTION

High speed digital circuits, defined as those having digital pulses exceeding 1 Mhz, exhibit behavior significantly different than that seen in lower speed circuits. This behavior is illustrated in FIGS. 1A–1C to which reference is now made. FIG. 1A illustrates an interconnect 10 connecting a driver 14 and an electrical contact 12 and FIGS. 1B and 1C are voltage vs. time graphs respectively illustrating a voltage pulse 16 produced by driver 14 and a resultant signal 17 at the interface between interconnect 10 and contact 12.

For example, pulse 16 may develop significant back reflection at the interface between the interconnect 10, made of metal or polysilicon, and the electrical contact 12, made of silicon. The back reflection propagates backwards along the interconnect 10, bouncing off the driver 14 and causing a ringing effect. Furthermore, the back reflection propagates along any other interconnects (not shown) to which interconnect 10 may be connected. Thus, the back reflection causes spurious, uncontrollable noise throughout the integrated circuit in which interconnect 10 is located.

The back reflection also increases the effective "rise time" of the pulse arriving at contact 12. The original pulse 16 transitions from a first value of 0, such as might indicate an OFF state, to a second value of 1, such as might indicate an ON state, during a "rise time" of $T_1$, where $T_1$ is typically 500 pico sec. The pulse 17 (FIG. 1C) with the back reflection, on the other hand, has a much larger effective rise time, denoted $T_2$, on the order of 2 nanoseconds.

Thus, the back reflection reduces the maximal operating speed of the integrated circuit (since $T_2$ is larger than $T_1$) and adds significant, uncontrollable noise to the operation. In high speed circuits, such a situation is untenable, especially in circumstances of high ON/OFF switching speeds.

In a second example, illustrated in FIGS. 2A and 2B to which reference is now made, a driver 15 is connected to a receiver transistor 18 (FIG. 2A) via an interconnect 21. A second interconnect 22, located nearby, is connected to a second receiver transistor 24.

In certain situations, the two interconnects 21 and 22 are capacitively cross-coupled such that if a pulse 26 having a very sharp transition from 1 V to 0 V propagates along interconnect 21, it induces a similar pulse 28 in interconnect 22. Receiver transistor 18 will transition in a normal manner from 1 V to 0 V; however, if receiver transistor 24 is already at 0 V, the pulse along interconnect 22 will induce transistor 24 to transition to a negative voltage value, typically of −0.7 V, which is the latched state. Once receiver transistor 24 is "latched up", it will not respond to any incoming signals.

The above described phenomenon is known as the "culprit-victim" problem, where interconnect 21 is the culprit and interconnect 22 is the victim, and is primarily caused by very sharp transitions. The sharp transitions also cause abrupt changes in the voltage level of the power supply because of the significant current demand of the transition.

SUMMARY OF THE PRESENT INVENTION

It is therefore an object of the present invention to provide apparatus for improving ON/OFF switching in high speed digital circuitry.

Applicants have realized that a major source of the back reflection is the mismatch in the impedance between the metal or polysilicon interconnect and the silicon electrical contact. Thus, the present invention includes apparatus for altering the impedance or capacitive loading of the interconnect. Two preferred embodiments for the apparatus are provided hereinbelow.

In the first preferred embodiment, the apparatus for altering is formed of capacitance altering elements which alter the capacitance and thereby the capacitive loading of the interconnect. Preferably, the capacitance altering elements include a plurality of dielectric materials having differing dielectric constants located near the portion of the interconnect near the contact.

For example, one or more strips of high dielectric material can be laid over the interconnect alternately with one or more strips of low dielectric material.

In the second preferred embodiment, the apparatus for altering includes resistance altering elements which alter the resistance of the interconnect. Preferably, the resistance altering elements are formed by selectively doping portions of the interconnect and contact which, for this embodiment, are formed of polysilicon.

Applicants have realized that doping polysilicon reduces its resistance (e.g. increases its conductivity). Therefore, in one embodiment of the present invention, the doping is gradually reduced along the interconnect, with the most doping being furthest from the contact. In an alternative embodiment, the doping is reduced in steps. In a further embodiment, the doping is uniform over the interconnect and contact.

The second improvement concerns the culprit-victim problem. Applicants have realized that the capacitive cross-coupling is highly sensitive to high frequency signals and that the sharp transition pulse on the culprit interconnect contains therein many high frequency components.

Therefore, there is provided, in accordance with the present invention, apparatus for altering the impedance of the interconnects so as to filter out the highest frequency components of the pulse on the culprit interconnect.

In accordance with one embodiment of the present invention, the apparatus for altering includes capacitance altering elements which alter the effective capacitance of the culprit interconnect. Preferably, the capacitance altering elements include depositions of a high dielectric constant material along at least a portion of the culprit interconnect.

The apparatus for altering alternatively includes resistance altering elements. Preferably, the resistance altering elements include selectively doped portions of the polysilicon interconnect, similar to that described hereinabove. However, the doped portions are those portions nearest to the interface of the interconnect and the driver of the culprit interconnect.

BRIEF DESCRIPTION OF THE DRAWINGS

The present invention will be understood and appreciated more fully from the following detailed description taken in conjunction with the drawings in which:

FIG. 7B is a partial schematic, partially block diagram top view illustration of the capacitance altered interconnect of FIG. 7A;

FIG. 7C is a cross-sectional illustration of the capacitance altered interconnect of FIG. 7A;

FIG. 8A is a circuit diagram illustration of a resistance altered interconnect for reducing back reflection, constructed and operative in accordance with a second embodiment of the present invention;

DETAILED DESCRIPTION OF A PREFERRED EMBODIMENT

As mentioned hereinabove, Applicants have realized that a major source of the back reflection is the impedance mismatch between the interconnect and the silicon electrical contact. This is illustrated in FIG. 3 to which reference is now made.

Figure 3:
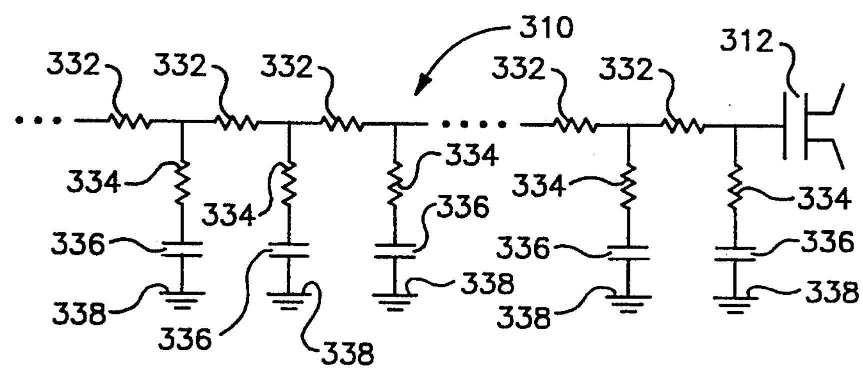
FIG. 3 is a circuit diagram illustration of a circuit model of a prior art interconnect.

FIG. 3 is a circuit diagram model for a prior art interconnect 310 connected to a contact 312. The interconnect 310 is modeled as being formed of a plurality of resistors 332 connected in series, each connected in parallel with a resistor 334 and a capacitor 336 connected to ground 338. Thus, the interconnect 310 of the prior art has an impedance formed of resistive and capacitive qualities. Typically, in the prior art, circuits are designed to reduce the capacitance of the interconnect 310, thereby to increase the operating speed of the circuit.

In the prior art model, each resistor 332 and 334 typically have resistances of about 5 milli-ohm/micron and the capacitors 336 have capacitances of 10 fepto-farad for a total capacitance of 200 fepto-farad. The contact 312 typically has a resistance of 1 ohm. A comparison of the two impedances indicates that, as understood by the Applicants, they are considerably mismatched.

Figure 1A:
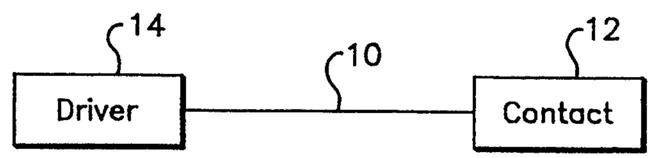
FIG. 1A is a schematic illustration of a prior art interconnect.
Figure 1B:
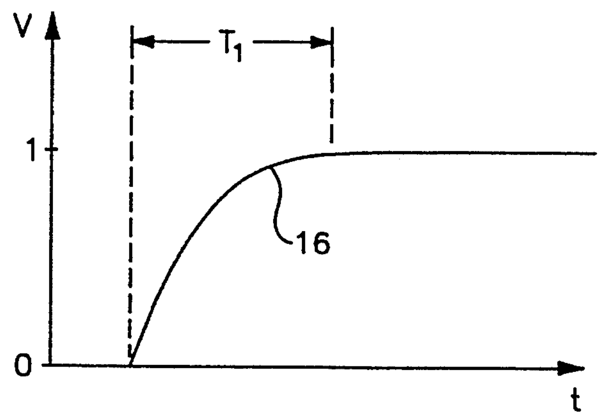
FIG. 1B is a graphical illustration of a pulse, useful in understanding the prior art.
Figure 1C:
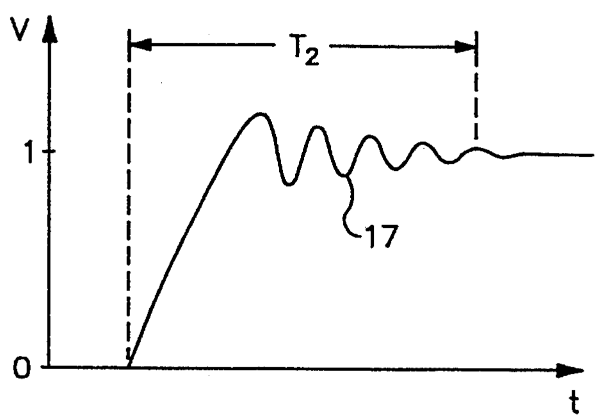
FIG. 1C is a graphical illustration of a back reflected pulse, useful in understanding the prior art.

At the contact 312, the higher impedance induces a series of phase delays into the pulse 16 (FIG. 1B) which causes the pulse 16 to no longer be coherent. This effect is the back reflection.

Figure 4:
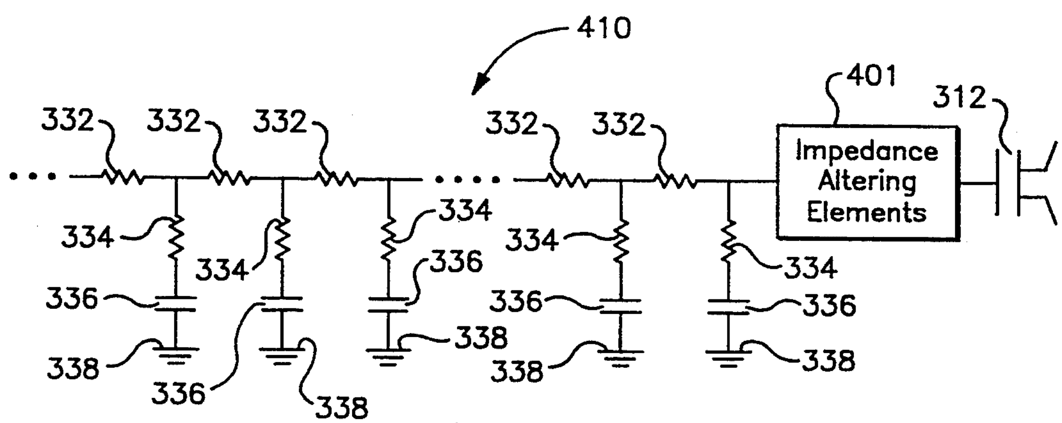
FIG. 4 is a partially schematic circuit diagram illustration of an impedance altered interconnect, constructed and operative in accordance with the present invention.

The present invention, therefore and as illustrated in FIG. 4 to which reference is now made, comprises elements 401 for changing (increasing) the impedance or capacitive loading of the interconnect, labeled 410. The specific elements and their connection to the interconnect will be described hereinbelow.

In first and second embodiments, elements 401 alter the impedance of the interconnect 410 to more closely match the impedance of the contact 312 or alter the capacitive loading of the interconnect 410, thereby reducing back reflections. Elements 401 can be placed on all interconnects 410 in the integrated circuit which interface with contacts, or on only some of them.

Figure 7A:
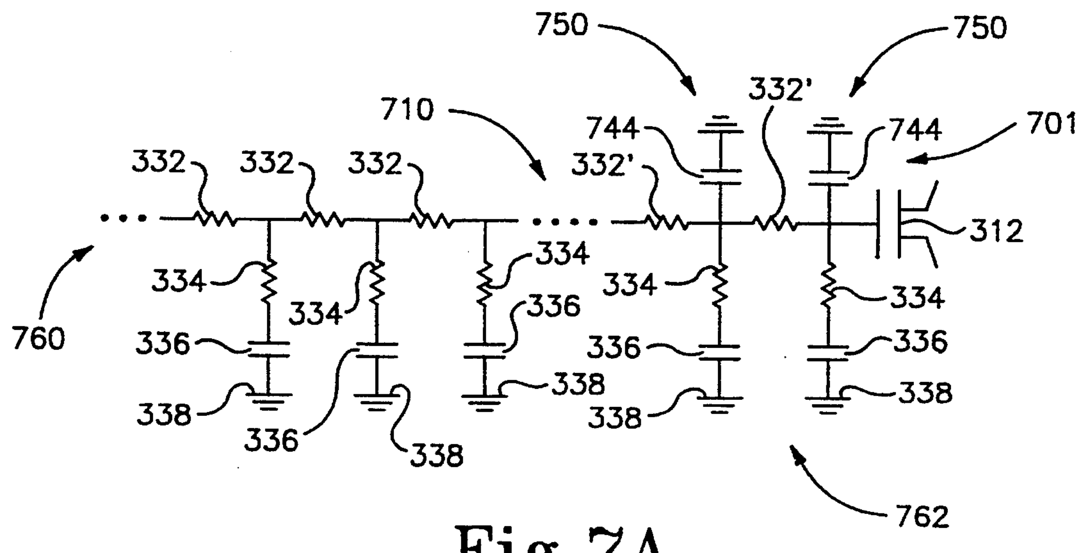
FIG. 7A is a circuit diagram illustration of a capacitance altered interconnect for reducing back reflection, constructed and operative in accordance with a first embodiment of the present invention.
Figure 8B:
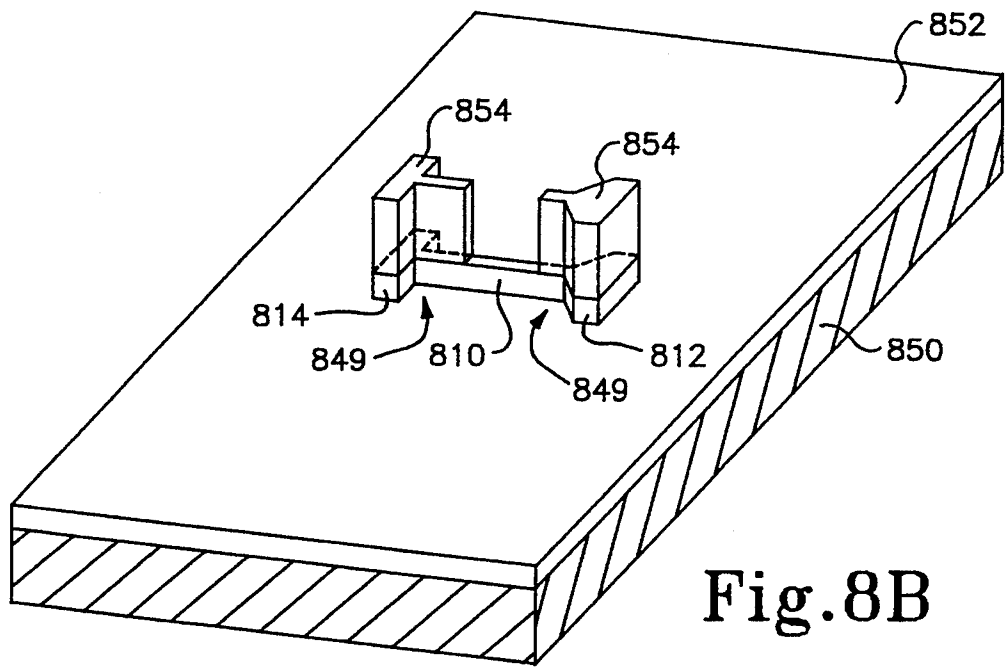
FIG. 8B is an isometric illustration of a step in the process of doping the interconnect in order to alter the resistance of the interconnect.

The first embodiment, described in detail with respect to FIGS. 7A–7C, increases the capacitive loading of the interconnect and the second embodiment, described in detail with respect to FIGS. 8A and 8B, increases the resistance of the interconnect.

Figure 5:
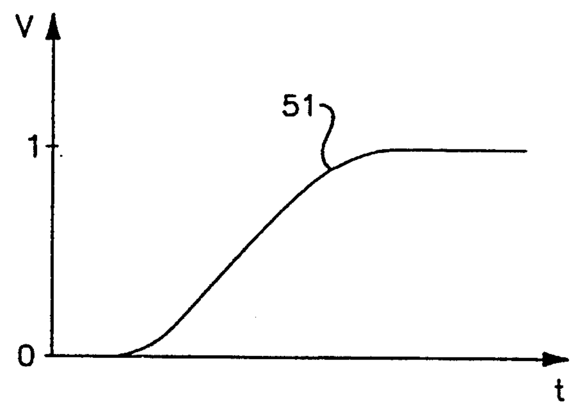
FIG. 5 is a graphical illustration of a pulse propagated in the impedance altered interconnect of FIG. 4.

FIG. 5, to which reference is now briefly made, is a voltage-time graph illustrating a generalized resultant pulse 516 for the first two embodiments. Because the impedance capacitive loading of the interconnect 410, in the area of the contact 312, is increased, the rate of voltage rise is decreased. As long as the total rise time is $T_2$ or less, the maximal operating speed of the circuit of the present invention is no worse than that of prior art circuits operating in the presence of back reflections. However, with the more evenly matched impedances, there are little or no back reflections and thus, much less spurious noise in the integrated circuit.

As mentioned hereinabove, Applicants have realized that the capacitive cross-coupling is highly sensitive to high frequency signals and that the sharp transition pulse on the culprit interconnect contains therein many high frequency components.

Figure 2A:
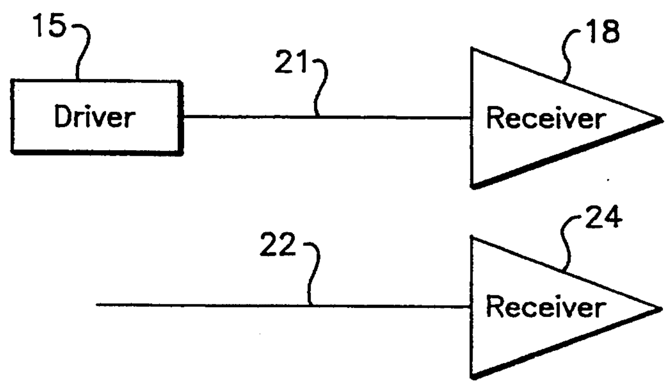
FIG. 2A is a schematic illustration of two cross-coupled prior art circuits.
Figure 9A:
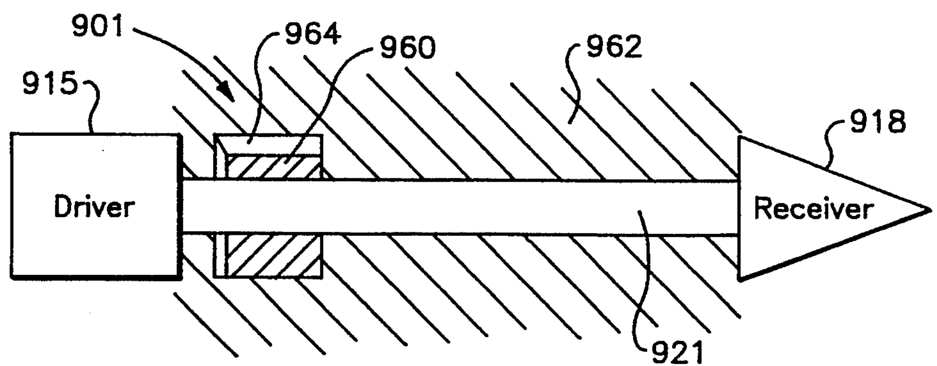
FIGS. 9A and 9B are top view, partially schematic, illustrations of two alternative capacitance altered interconnects for reducing fast initial rise times.
Figure 9B:
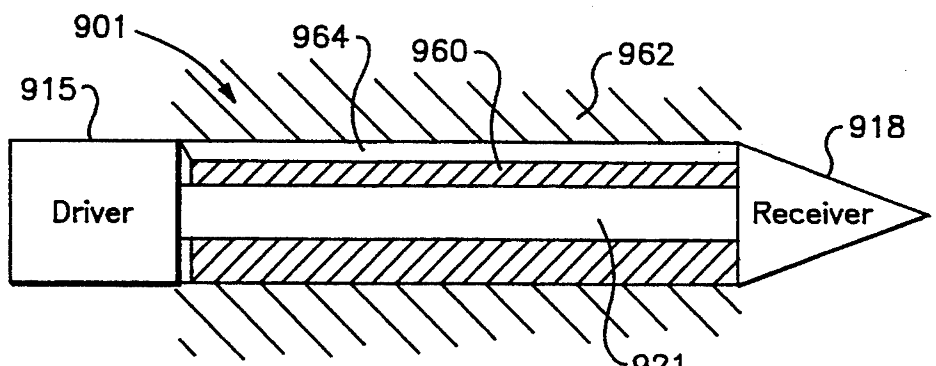

Therefore, in a third embodiment, described in detail with respect to FIGS. 9A and 9B, elements 401 increase the impedance capacitive loading of the interconnect in order to reduce the high frequency components of the sharp transition pulse on the culprit interconnect 21 (FIG. 2A). Elements 401 can be placed on all culprit interconnects 21 or only on some of them.

Figure 6:
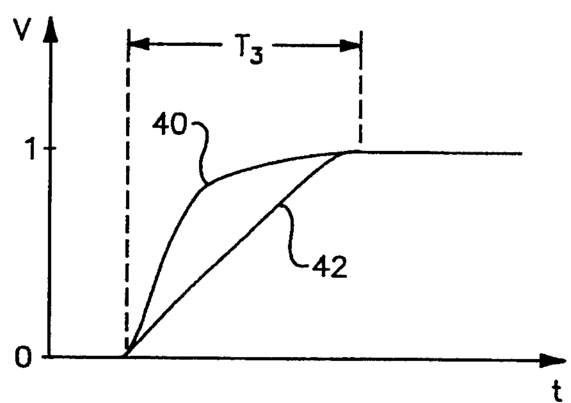
FIG. 6 is a graphical illustration of two pulses having two different rising rates, useful in understanding the prior art.

The shapes of a prior art transition pulse 40 and a present invention transition pulse 42 are illustrated in the voltage-time plot of FIG. 6 to which reference is now briefly made.

In circuits having the culprit-victim problem, the transitions from ON to OFF are typically relatively smooth. Typically, the prior art pulse 40, as it propagates along interconnect 21 (FIG. 2A), initially rises quickly to a value somewhat below the desired value (within, for example, 5%) and thereafter, slowly rises to the desired value. In total, the rise time is $T_3$. In contrast, the present invention pulse 42 steadily rises toward the second value, wherein the total rise time is also $T_3$. Although both pulses have the same rise time, pulse 42 has fewer high frequency components to it and therefore, will cause less capacitive cross-coupling.

Reference is now made to FIGS. 7A–7B which illustrate the first embodiment wherein elements, labeled 701, comprise capacitance increasing elements 750 located close to the contact 312 for increasing the capacitive loading of the interconnect. In this embodiment, the interconnect, labeled 710, may be formed of metal.

As illustrated in FIG. 7A, the capacitance increasing elements 750 have the effect of adding a few capacitors 744 to the circuit model, connected in parallel to those resistors, labeled 332', located near the contact 312. The capacitors 744 have little effect on the portion of the interconnect, labeled 760, furthest from the contact 312, thereby enabling a pulse to propagate relatively quickly along most of interconnect 710. However, the capacitors 744 significantly affect the capacitive loading of interconnect 710 in an area 762 near the contact 312, raising the capacitive loading of interconnect 710 312 and thereby reducing the rate of voltage rise, as illustrated in FIG. 5. This decreases the rate of voltage change when receiving a signal pulse similar to the pulse 26 of FIG. 2B.

For example and as shown in FIG. 7B, the capacitance increasing elements 750 can be strips 746*a* and 746*b* of dielectric materials laid over the interconnect 710 and operative to alter the apparent dielectric constant of interconnect 710. The strips 746*a,b* can either be directly touching the interconnect 710 or a thin oxide (not shown) can be placed therebetween.

The strips 746*a* and 746*b* are typically selected to have differing dielectric constants and to alternate with one another differing capacitance and impedance are created along the interconnect 710. In a preferred embodiment, the strips 746*a* are formed of silicon nitride, having a high dielectric constant and strips 746*b* are formed of silicon dioxide having a low dielectric constant.

It is noted that the capacitance increasing elements 750 can also be placed in an area 764 near the driver, labeled 714 (FIG. 7B).

The selection of types of materials, number of strips 746*a,b* and their thicknesses depend on the impedance of the contact 312 or driver 714 to be matched. The selection is typically performed with the help of a simulation program, such as SPICE.

Reference is now made to FIGS. 8A and 8B which illustrate a second embodiment of the present invention in which the impedance increasing elements are resistance increasing elements. In this embodiment, the resistance increasing elements have the effect of providing those resistors near a contact 812, and a driver 814, with gradually increasing values.

In FIG. 8A, five resistors near the contact 812 are labeled $R_{1-5}$ and five resistors near the driver 814 are labeled $R_{10-50}$. In accordance with the present invention, the resistances increase (i.e. $R_1<R_2<R_3$ etc. and $R_{10}<R_{20}<R_{30}$ etc.) so as to gradually increase the impedance of the interconnect, labeled 810, to approach that of the contact 812.

The increased resistance, which is equivalent to decreased conductivity, can be formed as follows:

As shown in FIG. 8B, the interconnect 810, contact 812 and driver 814 are formed of polysilicon on a silicon substrate 850 at least partially covered with silicon dioxide 852. Applicants have discovered that a semiconductor, such as the intrinsic polysilicon of the interconnect 810, contact 812 and driver 814, can be doped with an ion implant so as to increase its conductivity. Therefore, in accordance with the present invention, the interconnect 810, contact 812 and driver 814 can be selectively doped to provide a desired conductivity configuration. Such a conductivity configuration can be a gradual (smooth or stepped) decrease of conductivity near the interfaces of the interconnect 810 with either or both of driver 814 and contact 812 or it can be a uniform conductivity level for all elements.

In one embodiment of the invention and as illustrated in FIG. 8B, the doping is typically achieved as follows: areas, labeled 849, near contact 812 and driver 814 are first covered with a resist 854. The polysilicon interconnect 810 is then doped with an ion implant, such as phosphorous, an n-type dopant. The resist 854 is stripped and a second ion implant, also with phosphorous, is performed, implanting the interconnect 810, the contact 812 and the driver 814. The circuit is then heated and cooled to activate the dopant and to slightly spread it out.

Most of the interconnect 810 is thus implanted twice, providing it with a higher conductivity (e.g. lower resistance) than the areas 849 near the contact 812 and driver 814. Furthermore, due to the spreading of the dopant, there is a gradual increase of resistance near the interfaces of the interconnect 810 with the driver 814 and the contact 812.

Alternatively, the second ion implant can be a counterdoping implant, utilizing boron, a p-type implant.

To provide a uniform impedance level, only one implant is performed and no resist is placed on the contact 812 or driver 814.

Reference is now made to FIGS. 9A and 9B which illustrate a third embodiment of the present invention in which the elements, labeled 901, alter the impedance or capacitive loading in order to filter the high frequency components of a signal pulse such as pulse 40 shown in FIG. 6.

In contrast to the prior art in which the traditionally metal interconnect 20 of FIG. 2A is insulated with low dielectric constant materials such as deposited silicon dioxide, in the present invention, the culprit interconnect, labeled 921, is insulated with a high dielectric constant material 960, such as silicon nitride, laid into the low dielectric constant material, labeled 962. The high dielectric constant material 960 can by deposited either uniformly along the entire length of the interconnect 921 from a driver 914 to a receiver 918, as shown in FIG. 9B, or only at an end 963 of the interconnect 921 near the driver 914, as shown in FIG. 9A.

Figure 2B:
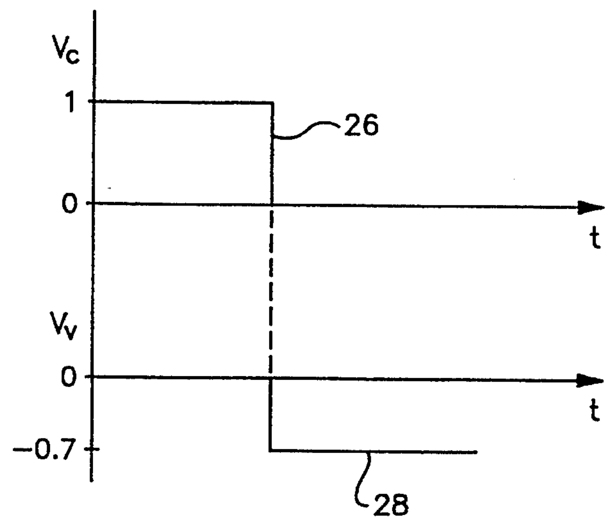
FIG. 2B is a graphical illustration of two pulses in the prior art circuit of FIG. 2A.

The introduction of a high dielectric constant material 960, in a controlled fashion, near the signal carrying culprit interconnect 921 has the affect of increasing the capacitive loading of the interconnect which, as desired, decreases its rate of voltage rise (i.e. its rate of voltage change) when receiving a signal pulse similar to pulse 26 of FIG. 2B. The high dielectric constant material should be such that it does not affect the total rise time, but only the initial voltage rate of change.

The interconnects 921 of FIGS. 9A and 9B are manufactured by first cutting windows 964 into the low dielectric material 962, by methods well known in the art. The high dielectric constant material 960 is then deposited over the entire integrated circuit and etched back, removing those portions of material 960 not covering a culprit interconnect 921. The metal interconnect 921 is then deposited, cladding the remaining high dielectric material 960 portions and the low dielectric material 962.

It will be appreciated that the high dielectric material 962 and the metal interconnect 921 form a capacitor. If the capacitor has a small enough capacitance, it will filter out only the highest frequency components of the signal pulse (as pulse 40 shown in FIG. 6).

Alternatively although not shown, the impedance altering elements altering the impedance of the culprit interconnect 921 can be formed of resistance altering elements. The resistance altering elements are the same as those described with respect to the second embodiment illustrated in FIGS. 8A and 8B; however, in this alternative embodiment, the doping is placed only near the driver 914 of culprit interconnect 921.

It will be appreciated by persons skilled in the art that the present invention is not limited to what has been particularly shown and described hereinabove. Rather the scope of the present invention is defined by the claims which follow:

We claim:

1. An integrated circuit comprising:

an interconnect: and resistance increasing means located near a high impedance element, and wherein:

a resistance of said resistance increasing means progressively increases toward said high impedance element, said interconnect is formed of polysilicon, and said resistance increasing means comprises a doped portion of said interconnect wherein the amount of dopant decreases continuously toward said high impedance element.

2. An integrated circuit as in claim 1, wherein said high impedance element comprises a contact.

3. An integrated circuit as in claim 2, in which said contact is formed of silicon.

4. An integrated circuit as in claim 1, further comprising:

a circuit driver; wherein said interconnect connects said circuit driver to said high impedance element.

5. An integrated circuit as in claim 4, wherein said high impedance element comprises a contact.

6. An integrated circuit as in claim 5, wherein said contact is formed of silicon.

* * * * *